(12) United States Patent
Kerselaers et al.

(10) Patent No.: US 10,826,627 B1
(45) Date of Patent: Nov. 3, 2020

(54) NEAR-FIELD MEASURING DEVICE

(71) Applicant: NXP B.V., Eindhoven (NL)

(72) Inventors: Anthony Kerselaers, Herselt (BE); Liesbeth Gommé, Anderlecht (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/840,495

(22) Filed: Apr. 6, 2020

(51) Int. Cl.
*H04B 5/00* (2006.01)
*H04B 17/20* (2015.01)
*H01Q 7/00* (2006.01)

(52) U.S. Cl.
CPC ............... *H04B 17/20* (2015.01); *H01Q 7/00* (2013.01); *H04B 5/0012* (2013.01)

(58) Field of Classification Search
CPC ........ H04B 17/20; H04B 5/02; H04B 5/0012; H04B 5/0043; H04B 5/0081; H01Q 7/00; G01V 3/101
See application file for complete search history.

(56) References Cited

U.S. PATENT DOCUMENTS

| | | | |
|---|---|---|---|
| 8,274,386 B1 | 9/2012 | Dea et al. | |
| 10,277,284 B1* | 4/2019 | Kerselaers | H04B 5/0031 |
| 2007/0218837 A1* | 9/2007 | Lessing | H04B 5/0043 455/41.2 |
| 2012/0129451 A1* | 5/2012 | Metivier | H04L 63/061 455/41.1 |
| 2014/0018017 A1* | 1/2014 | Merlin | H04B 5/0037 455/90.1 |
| 2018/0241483 A1* | 8/2018 | Park | H04B 13/005 |
| 2019/0341678 A1* | 11/2019 | Gomme | H01Q 7/00 |

OTHER PUBLICATIONS

Speag, Schmid & Partner Engineering AG; "TDS Systems"; retreived from the Internet https://speag.swiss/products/tds/tds-time-domain-sensor-systems/ ; 1 page (Apr. 2, 2020).

* cited by examiner

*Primary Examiner* — Thanh C Le

(57) ABSTRACT

One example discloses a near-field measuring device, including: a near-field antenna; a tuning circuit galvanically coupled to the near-field antenna and configured to set a resonant frequency and/or a quality factor of the measuring device; and a current sensor inductively coupled to the near-field antenna and configured to generate a signal in response to a current flowing through the galvanic coupling between the near-field antenna and the tuning circuit; wherein the signal represents a measurement of non-propagating quasi-static near-field signals received by the near-field antenna.

19 Claims, 4 Drawing Sheets

NEAR-FIELD MEASURING DEVICE

The present specification relates to systems, methods, apparatuses, devices, articles of manufacture and instructions for near-field measurement.

SUMMARY

According to an example embodiment, a near-field measuring device, comprising: a near-field antenna; a tuning circuit galvanically coupled to the near-field antenna and configured to set a resonant frequency and/or a quality factor of the measuring device; and a current sensor inductively coupled to the near-field antenna and configured to generate a signal in response to a current flowing through the galvanic coupling between the near-field antenna and the tuning circuit; wherein the signal represents a measurement of non-propagating quasi-static near-field signals received by the near-field antenna.

In another example embodiment, the current sensor is a transformer or a toroidal coil.

In another example embodiment, the current sensor is configured to amplify the current flowing in the galvanic coupling.

In another example embodiment, the tuning circuit includes a capacitance and a resistance.

In another example embodiment, the near-field antenna includes a set of conductive surfaces configured to be responsive to an electric near-field signal; the conductive surfaces together form a capacitance; the tuning circuit capacitance is larger than the conductive surfaces capacitance such that a larger portion of the current flowing through near-field antenna flows through the tuning circuit capacitance; and the current sensor is inductively coupled in series with the tuning circuit capacitance and coupled in parallel with the tuning circuit resistance.

In another example embodiment, further comprising a sensing element; wherein the current sensor includes a primary winding and a secondary winding; wherein the primary winding is galvanically coupled to the near-field antenna; and wherein the secondary winding is inductively coupled to the primary winding, and galvanically coupled to the sensing element.

In another example embodiment, the sensing element includes a resistance; the signal is a voltage; and the resistance is configured to generate the voltage in response to the current flowing through the primary winding.

In another example embodiment, the sensing element includes a low noise amplifier; the signal is a voltage; and the low noise amplifier is configured to generate an amplified output signal in response to the current flowing through the primary winding.

In another example embodiment, the sensing element is configured to be coupled to a measurement instrument; and the measurement instrument is configured to output either a magnetic near-field strength signal and/or an electric near-field strength signal in response to the current flowing through the primary winding.

In another example embodiment, the sensing element is configured to be coupled to a baseband communications circuit; and the communications circuit is configured to output a communications signal in response to the current flowing through the primary winding.

In another example embodiment, the tuning circuit includes a variable tuning capacitance bank configured to set a resonant frequency of the near-field antenna in response to a control line.

In another example embodiment, the tuning circuit includes a variable tuning resistance bank configured to set a quality factor or bandwidth of the near-field antenna in response to a control line.

In another example embodiment, the tuning circuit includes a fixed tuning capacitance configured to set a fixed resonant frequency of the near-field antenna and a fixed tuning resistance configured to set a fixed quality factor or bandwidth of the near-field antenna.

In another example embodiment, the current flowing in the galvanic coupling between the near-field antenna and the tuning circuit is generated only by the non-propagating quasi-static near-field signals received by the near-field antenna.

In another example embodiment, the near-field antenna is a near-field magnetic antenna responsive to non-propagating quasi-static near-field magnetic signals.

In another example embodiment, the near-field antenna is a near-field electric antenna responsive to non-propagating quasi-static near-field electric signals.

In another example embodiment, the near-field antenna is a near-field electromagnetic antenna responsive to non-propagating quasi-static near-field electric and magnetic signals.

In another example embodiment, the near-field measuring device is configured to be capacitively coupled to an external conductive surface from which the measurement of non-propagating quasi-static near-field signals is to be made.

In another example embodiment, the near-field measuring device is embedded in at least one of: a wearable device; a smart watch; a smartwatch housing, an earbud, a hearing aid, a medical device, an activity tracker, or a heart rate monitor.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
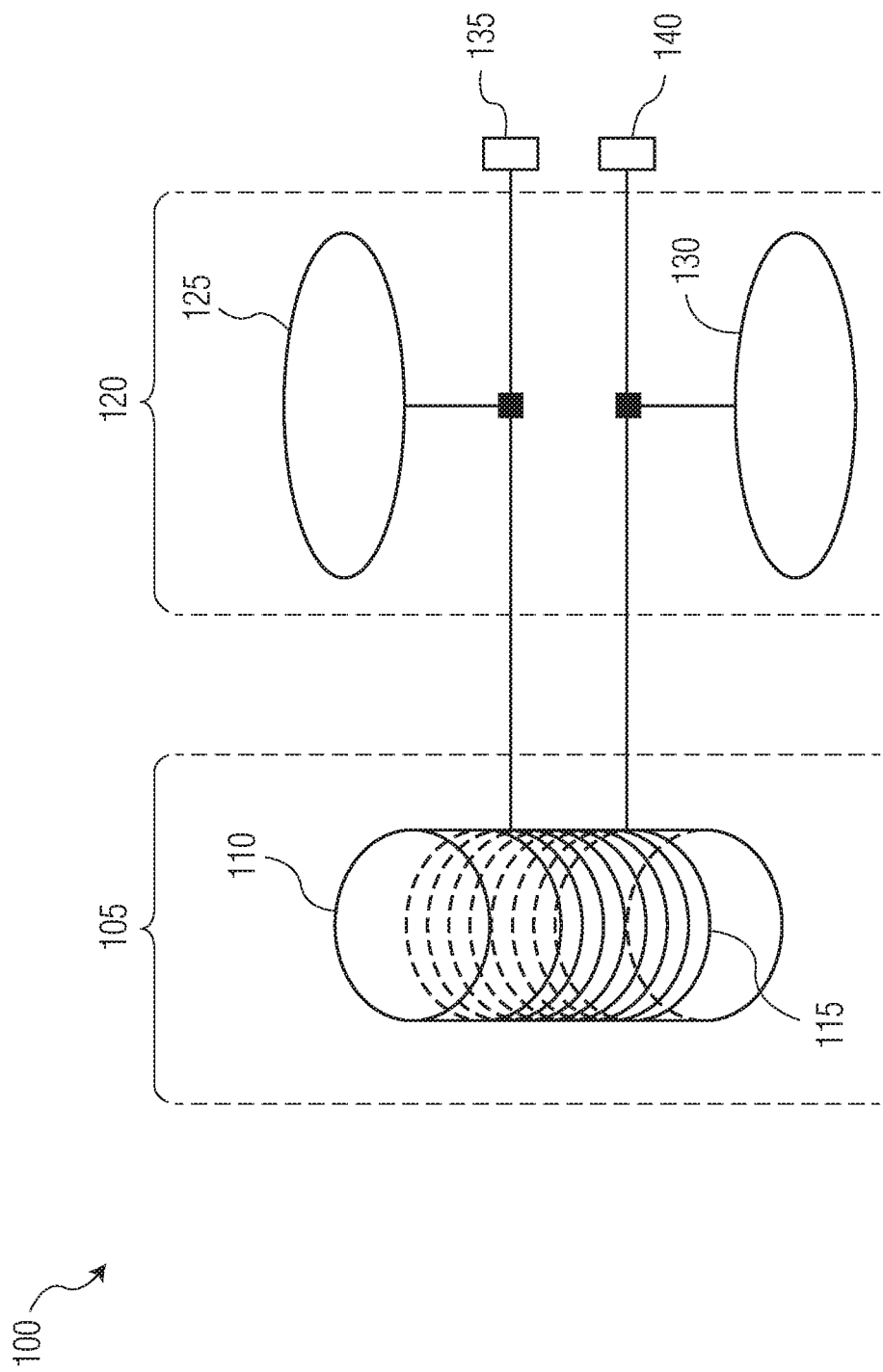
FIG. 1 is an example near-field antenna.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Herein discussed are near-field interactions between a near-field device, perhaps on a user's body, and other conductive surfaces and/or other wireless networked devices (e.g. Internet of Things (IoT) devices, wearables, earbuds, body area networks, gaming products and medical products like continuous glucose monitoring, etc.) based on near-field electromagnetic induction (NFEMI), where the transmitter and receiver are coupled by both magnetic (H) and electric (E) fields. While RF wireless communication is accomplished by propagating an RF plane wave through free space, NFEMI communication utilizes non-propagating quasi-static H and E fields.

An H-field antenna (i.e. magnetic antenna) is primarily sensitive to magnetic fields and/or primarily initiates magnetic fields when driven by a current. Any E-field component from an H-field antenna is strongly reduced (e.g. −20 to −60 dB reduction, a factor of 0.1 to 0.0008 (10% to 0.08%) depending on the antenna design).

A small loop antenna is an example H-field antenna and includes a loop antenna with dimensions much smaller than the wavelength of its use. The small loop antenna does not resonate at the NFEMI carrier frequency but is instead tuned to resonance by an external reactance. In some example embodiments the current in the small loop antenna has in every position of the loop the same value.

An E-field antenna (i.e. electric antenna) is primarily sensitive to electric fields and/or primarily initiates electric fields when driven by a voltage. Any H-field component from an E-field antenna is strongly reduced (e.g. −20 to −60 dB reduction, a factor of 0.1 to 0.0008 (10% to 0.08%) depending on the antenna design).

A short loaded dipole antenna is an example E-field antenna and includes a short dipole with dimensions much smaller than the NFEMI carrier frequency and in some example embodiments has extra capacitance surfaces at both ends.

The quasi-static characteristic of these fields is a result of the NFEMI antenna dimensions in combination with their carrier frequencies. Most of the near-field energy is stored in the form of magnetic and electric fields, while a small amount of RF energy inevitably propagates in free space. Small antenna geometries minimize radiating waves in free space.

Some wearables, such as hearing aids and wireless earbuds, employ Near-Field Magnetic Induction (NFMI) as a wireless communication method. In NFMI wireless communication, two loosely coupled coils realize signal transfer. No radiation of radio waves takes place. A current flowing in the transmission coil generates a H-field which in turn induces a current in the receiving coil. In this way, wireless communication is accomplished. Unfortunately, H-field based NFMI systems with small antenna coils have a limited range that may be much smaller than an entire wearable user's body. Such H-field communications are sensitive to coil orientation. In the case of a hearing aid form factor, a H-field induction based system cannot cover an entire human body. However, since in hearing aids both coils are always aligned with each other, they are not influenced by the movement of the human body.

Other wearables employ Near-field Electric Induction (NFEI)) as a wireless communication method. NFEI allows electronic devices on and near a conductive surface (e.g. a human body) to exchange information through E-field coupling (e.g. at 21 MHz). NFEI is also sometimes called Body Coupled Communication (BCC). While E-field based NFEI signals can have a greater range than H-field based NFMI signals, the E-field signal strength can vary with regard to body posture and is sensitive to body movements. The body can even partially block a capacitive return path, thereby increasing E-field channel loss and reliable and robust wireless communication is not possible.

Ensuring robust near-field communications however may require carefully measuring and characterizing the near-field environment (e.g. normal body generated fields, noise, other devices, etc.) surrounding such devices. Such near-field signals can be very difficult to measure since they are concentrated very close to a user's body and have relatively low amplitudes.

Existing electric and magnetic field measuring instruments are designed for measuring much stronger and further distant far-field signals (e.g. for electromagnetic compatibility (EMC) and radiation patterns, etc.). Such instruments may only be capable of electromagnetic field strengths as low as 500 mV/m.

Now discussed are example embodiments of a near-field measuring device tailored to measuring these concentrated, low level near-field signals near conductive body surfaces and/or in surrounding environments. These example embodiments are capable of measuring electromagnetic field strengths as low as 10 mV/m. Once captured, these near-field signals can then be recorded and characterized by additional diagnostic devices such as a frequency spectrum analyzers or oscilloscopes.

FIG. 1 is an example near-field antenna 100. In some example embodiments, the antenna 100 includes a coil (H-field) antenna 105 for magnetic fields, in conjunction with a short loaded dipole (E-field) antenna 120 for electric fields. The H-field antenna 105 includes a ferrite core 110 wound with wire 115. The E-field antenna 120 includes two conductive loading structures 125 and 130. Antenna 100 feed points 135, 140 are coupled to various tuning, measurement, and/or transceiver circuitry, such as downstream resonance frequency and bandwidth tuning banks, current sensors, and radio transmitter and receiver integrated circuit (RF-IC).

When the NFEMI antenna 100 is proximate to a structure (e.g. a conductive structure, a body, a person, an object, etc.) the magnetic and electric fields that are substantially confined to the structure and not significantly radiate in free-space can in some example embodiments be measured with much greater sensitivity.

In various example embodiments, the antenna 100 operates at or below 50 MHz (e.g. for example at 30 MHz) to ensure that the fields are following the structure's contours and to ensure that far field radiation is strongly reduced.

While the near-field antenna 100 shown is an NFEMI antenna, in other example embodiments just the coil (H-field) antenna 105 or the short loaded dipole (E-field) antenna 120 could be separately used if only magnetic (H) fields or electric (E) fields are to be respectively sensed and measured.

Figure 2:
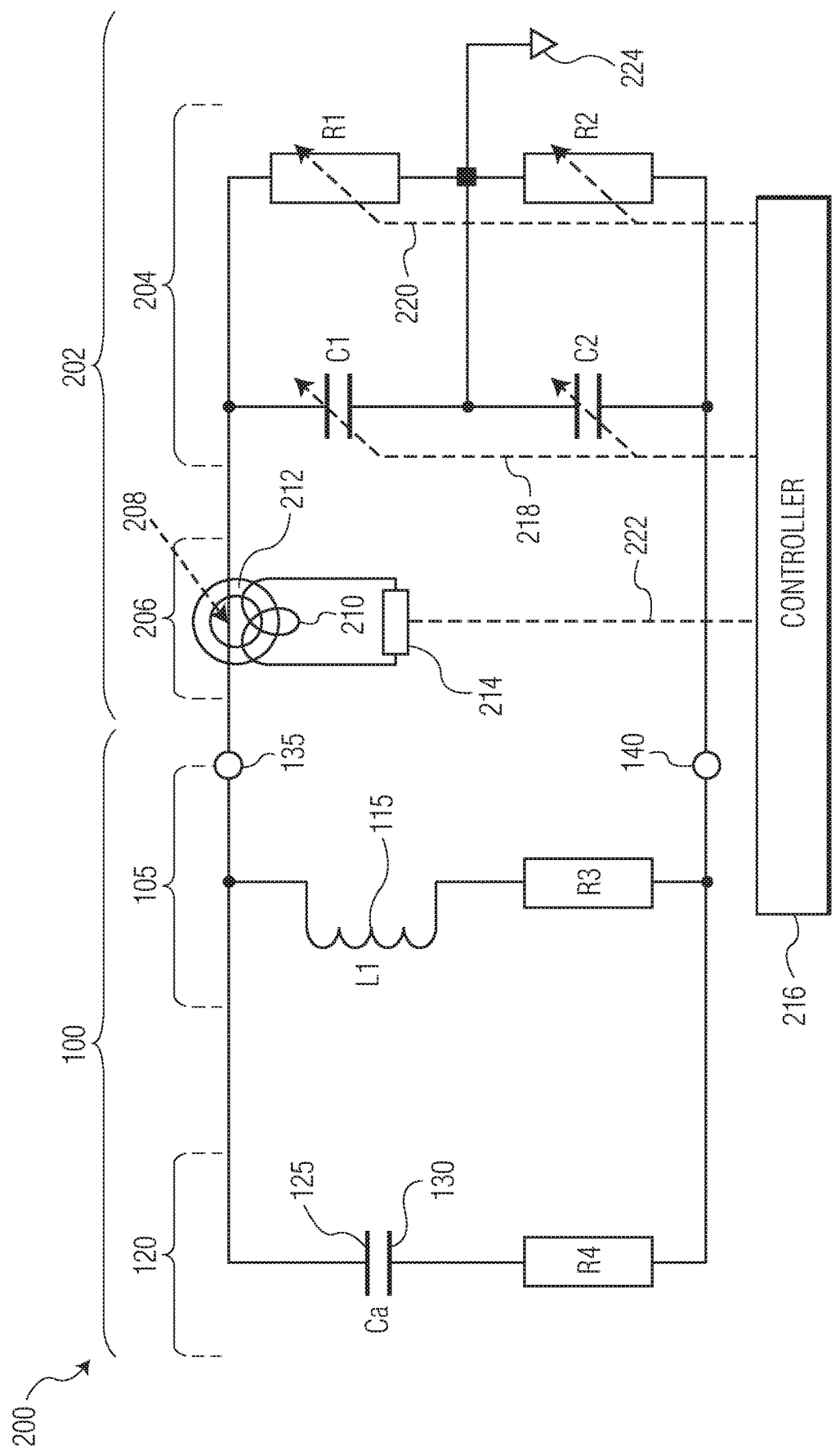
FIG. 2 is an example of a first near-field measurement device.

FIG. 2 is an example of a first near-field measurement device 200. The first near-field measuring device 200 includes the near-field antenna 100, supporting circuits 202, and configured to receive non-propagating quasi-static near-field signals. The near-field measuring device 200 is configured to receive and measure a non-propagating quasi-static near-field signal. Note that the near-field antenna 100 may in some example embodiments also be coupled to a transmitter circuit (not shown) for two-way communications.

The example idealized antenna 100 includes the magnetic (H-field) antenna 105 having a resistance (R3) and an inductance (L1), the electric (E-field) antenna 120 having a conductive structure formed from the two loading plates 125 and 130 and a resistance (R4), and the two feeding points 135, 140.

The supporting circuits 202 include a tuning circuit 204, a current sensor 206, and a controller 216.

The tuning circuit 204 is coupled to the first and second feed points 135, 140. The tuning circuit 204 includes a first variable tuning capacitance bank (C1), a second variable tuning capacitance bank (C2), a first variable tuning resistance bank (R1), and a second variable tuning resistance bank (R2). The capacitance banks and resistance banks are coupled to a ground 224. The capacitive banks are coupled to the controller 216 by control line 218, and the resistance banks are coupled to the controller 216 by control line 220.

The controller 216 adjusts the first and second capacitance banks (C1), (C2) to adjust a resonant frequency of the magnetic 105 and the electric 120 antennas (e.g. to 10.6 MHz). The controller 216 adjusts the first and second resistance banks (R1), (R2) to adjust a bandwidth of the magnetic 105 and the electric 120 antennas (e.g. to 400 KHz) sufficient to allow the non-propagating quasi-static near-field signal to be received from the antennas 105, 120.

The capacitance banks (C1), (C2) are equally tuned using the control line 218 from the controller 216, and the resistance banks (R1), (R2) are equally tuned using the control line 220 from the controller 216.

The current sensor 206 includes a primary winding 208 galvanically coupled to the near-field antenna 100 and the tuning circuit 204. The current sensor 206 also includes a secondary winding 210 inductively coupled to the primary winding 208 via an optional ferrite core 212 and to a sensing element 214 (e.g. resistor). The current sensor 206 in some example embodiments is a transformer or toroidal coil.

The current sensor 206 inductively couples the near-field antenna 100 to the sensing element 214 to help reduce current draw, enable greater sensitivity, and minimize loading of the near-field antenna 100 for improved near-field sensitivity. The inductively sensed resonant current is converted to a voltage across the sensing element 214 for further instrument capture and analysis.

The controller 216 is then coupled to receive a signal (e.g. voltage) from the sensing element 214 by a measure line 222.

When the near-field measuring device 200 is receiving the non-propagating quasi-static near-field signal, the signal generated across the sensing element 214 can be measured by the controller 216. The voltage generated can in some example embodiments be used as frontend for a baseband receiver in a body communication device.

Figure 3:
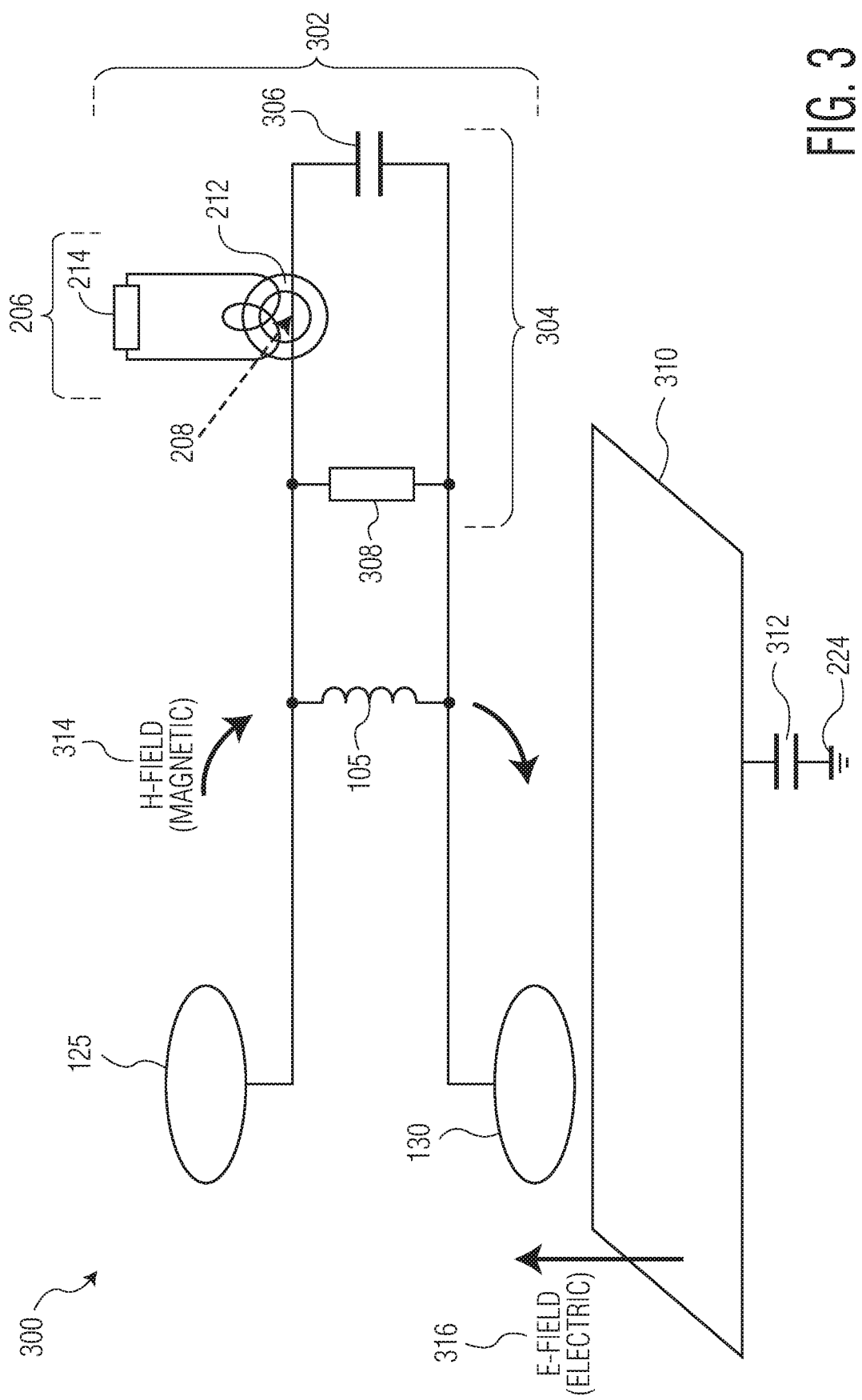
FIG. 3 is an example application of a second near-field measurement device.

FIG. 3 is an example application 300 of a second near-field measurement device 302. This second near-field measurement device 302 used in this example application 300 is a modified version of the first near-field measuring device 200.

The coil (H-field) antenna 105, conductive surfaces 125, 130 and the current sensor 206 are the same as for the first near-field measuring device 200; however, the second near-field measurement device 302 includes different tuning circuit 304 that instead includes a fixed tuning capacitance 306 and a fixed tuning resistance 308.

These fixed tuning parameters result in a more compact device 302 that is tuned to a particular resonance frequency and bandwidth for a particular set of applications. For example if a measurement is required at 10 MHz with a bandwidth of 400 kHz, the tuning capacitor 306 may be 60 pF and the tuning resistance 308 may be 12 kOhm.

The second near-field measurement device 302 is positioned close to a conductive structure 310 (e.g. a human body). The conductive structure 310 forms a capacitance 312 (e.g. 100 pF) with the ground 224.

Conductive surface 130 is positioned close to the conductive structure 310 and located at the position where the electric and/or the magnetic fields are to be measured. Conductive surface 125, is positioned further away from the conductive structure 310 compared with the conductive surface 130. Both conductive surfaces 125, 130 together form their own capacitance. The capacitance value is depending on the dimensions but practical values can be in the order of 5 pF.

When both conductive surfaces 125, 130 are in the presence of an electric (E-field) 316, a voltage is induced between them and since the conductive surface 130 is close to the conductive structure 310 the electric (E-field) 316 present on the conductive structure 310 will induce a voltage between both surfaces 125, 130. The magnetic (H-field) 314, which is not influenced by the conductive structure 310 in case it is a living body, will also induce a voltage in the magnetic coil antenna 105.

In some example embodiments, the near-field measuring device's 302 tuning capacitance 306 is much larger than the capacitance between the conductive surfaces 125, 130. In such embodiments, a large part of the second near-field measurement device's 302 resonance current flows through the tuning capacitance 306 and thus the primary winding 208 portion of the current sensor 206 is positioned between the tuning capacitance 306 and the tuning resistance 308 as shown in FIG. 3.

The controller 212 is not shown in this figure but would be coupled to the sensing element 214 of the current sensor 206 as discussed in FIG. 2.

Figure 4:
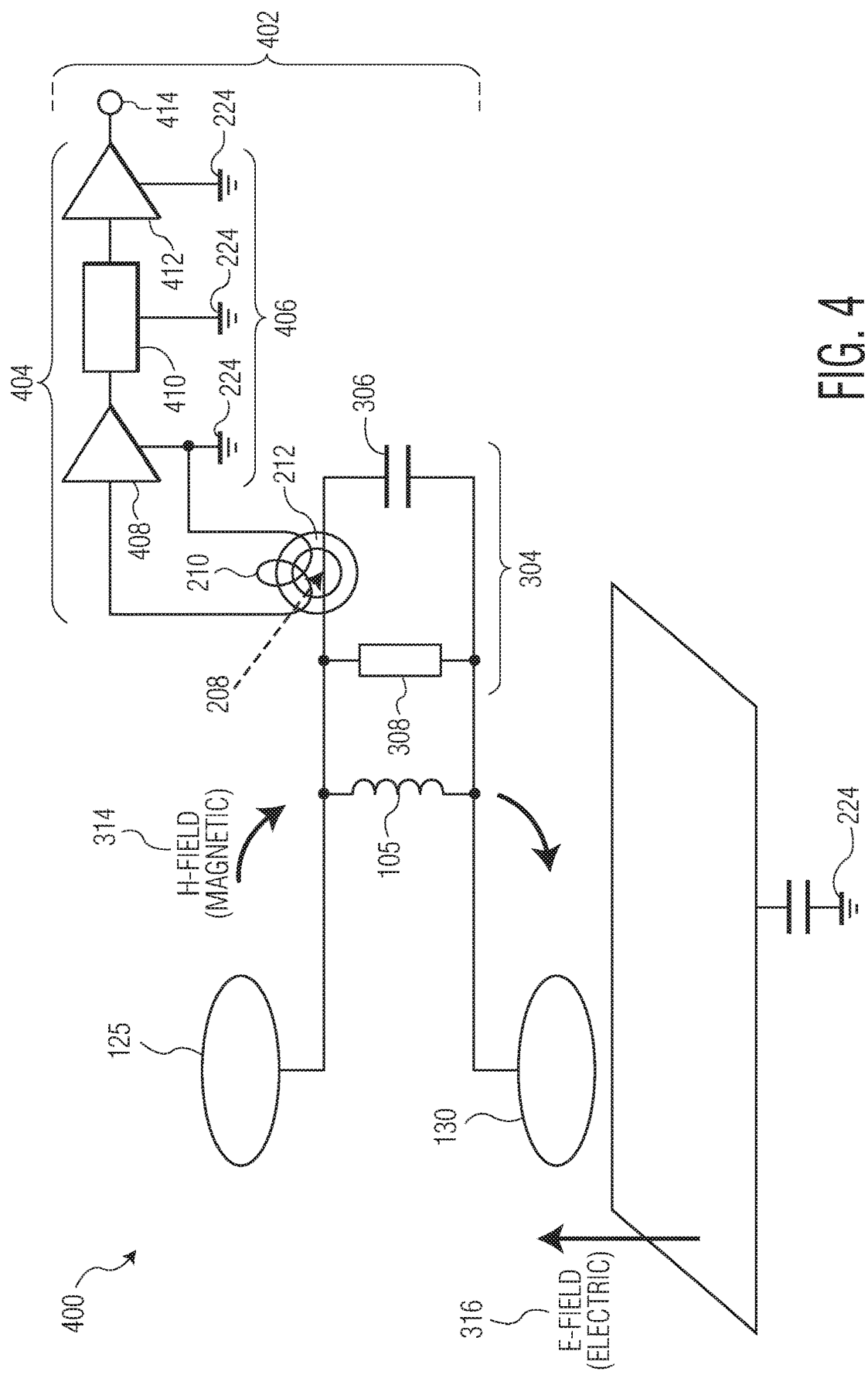
FIG. 4 is an example application of a third near-field measurement device.

FIG. 4 is an example application 400 of a third near-field measurement device 402. The third near-field measurement device 402 is similar to the second near-field measurement device 302, however a different current sensor 404 is included. The current sensor 404 includes the primary winding 208, the secondary winding 210, and an optional ferrite core 212; however a new sensing element 406 is included.

The sensing element 406 includes a first LNA 408, a filter 410, a second LNA 412, and an output 414. The first LNA 408 is connected to the secondary winding 210 and converts the secondary winding 210 current into an amplified voltage. This amplified voltage can be directly coupled to a measurement instrument or baseband communications circuit for further processing.

However, if the filter 410 is included the second LNA 412 may be used to provide sufficient output voltage so that the measurement instrument or baseband communications circuit has sufficient signal strength.

Also the output 414 may be connected to the measurement instrument or baseband communications circuit with a coaxial cable. The measurement instrument or baseband communications circuit can be capacitively coupled to ground 224 via their mains power supply.

Grounding 224 of the mains power supply enables more accurate sensing of the electric fields such that the measurement instrument or baseband communications circuit do not themselves become part of the antennas and thereby overestimate the measured currents.

Thus capacitive currents on the cables and conductive parts of the LNAs 408, 412 and measurement instrument or baseband communications circuit have to be reduced as much as possible. This is done by using the current sensor 404 in a series configuration with the tuning capacitor 306 and by reducing any stray capacitance between the primary and secondary windings of the current sensor and all device 402 elements are coupled to ground 224.

Various applications of these near-field measurement devices 200, 302, 402 include: monitoring a quality of on-body links, use as a new frontend for applications with industrial interference, as a measuring device for Human Exposure to wireless body area devices, or for regular near-field (e.g. NFEMI, NFEI, NFMI, etc.) communications.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A near-field measuring device, comprising:
a near-field antenna;
a tuning circuit galvanically coupled to the near-field antenna and configured to set a resonant frequency and/or a quality factor of the measuring device; and
a current sensor inductively coupled to the near-field antenna and configured to generate a signal in response to a current flowing through the galvanic coupling between the near-field antenna and the tuning circuit;
wherein the signal represents a measurement of non-propagating quasi-static near-field signals received by the near-field antenna.

2. The device of claim 1:
wherein the current sensor is a transformer or a toroidal coil.

3. The device of claim 1:
wherein the current sensor is configured to amplify the current flowing in the galvanic coupling.

4. The device of claim 1:
wherein the tuning circuit includes a capacitance and a resistance.

5. The device of claim 4:
wherein the near-field antenna includes a set of conductive surfaces configured to be responsive to an electric near-field signal;
wherein the conductive surfaces together form a capacitance;
wherein the tuning circuit capacitance is larger than the conductive surfaces capacitance such that a larger portion of the current flowing through near-field antenna flows through the tuning circuit capacitance; and
wherein the current sensor is inductively coupled in series with the tuning circuit capacitance and coupled in parallel with the tuning circuit resistance.

6. The device of claim 1:
further comprising a sensing element;
wherein the current sensor includes a primary winding and a secondary winding;
wherein the primary winding is galvanically coupled to the near-field antenna; and
wherein the secondary winding is inductively coupled to the primary winding, and galvanically coupled to the sensing element.

7. The device of claim 6:
wherein the sensing element includes a resistance;
wherein the signal is a voltage; and wherein the resistance is configured to generate the voltage in response to the current flowing through the primary winding.

8. The device of claim 6:
wherein the sensing element includes a low noise amplifier;
wherein the signal is a voltage; and
wherein the low noise amplifier is configured to generate an amplified output signal in response to the current flowing through the primary winding.

9. The device of claim 6:
wherein the sensing element is configured to be coupled to a measurement instrument; and
wherein the measurement instrument is configured to output either a magnetic near-field strength signal and/or an electric near-field strength signal in response to the current flowing through the primary winding.

10. The device of claim 6:
wherein the sensing element is configured to be coupled to a baseband communications circuit; and
wherein the communications circuit is configured to output a communications signal in response to the current flowing through the primary winding.

11. The device of claim 1:
wherein the tuning circuit includes a variable tuning capacitance bank configured to set a resonant frequency of the near-field antenna in response to a control line.

12. The device of claim 1:
wherein the tuning circuit includes a variable tuning resistance bank configured to set a quality factor or bandwidth of the near-field antenna in response to a control line.

13. The device of claim 1:
wherein the tuning circuit includes a fixed tuning capacitance configured to set a fixed resonant frequency of the near-field antenna and a fixed tuning resistance configured to set a fixed quality factor or bandwidth of the near-field antenna.

14. The device of claim 1:
wherein the current flowing in the galvanic coupling between the near-field antenna and the tuning circuit is generated only by the non-propagating quasi-static near-field signals received by the near-field antenna.

15. The device of claim 1:
wherein the near-field antenna is a near-field magnetic antenna responsive to non-propagating quasi-static near-field magnetic signals.

16. The device of claim 1:
wherein the near-field antenna is a near-field electric antenna responsive to non-propagating quasi-static near-field electric signals.

17. The device of claim 1:
wherein the near-field antenna is a near-field electromagnetic antenna responsive to non-propagating quasi-static near-field electric and magnetic signals.

18. The device of claim 1:
wherein the near-field measuring device is configured to be capacitively coupled to an external conductive surface from which the measurement of non-propagating quasi-static near-field signals is to be made.

19. The device of claim 1:
wherein the near-field measuring device is embedded in at least one of: a wearable device; a smart watch; a smartwatch housing, an earbud, a hearing aid, a medical device, an activity tracker, or a heart rate monitor.

* * * * *